US012690454B2

(12) United States Patent
Al Nukari et al.

(10) Patent No.: US 12,690,454 B2
(45) Date of Patent: Jul. 21, 2026

(54) ELECTRONIC PACKAGE AND DEVICE COMPRISING THE SAME

(71) Applicant: Ampleon Netherlands B.V., Nijmegen (NL)

(72) Inventors: Atef Al Nukari, Nijmegen (NL); Jorge Manuel Soares Teixeira, Nijmegen (NL)

(73) Assignee: Ampleon Netherlands B.V., Nijmegen (NL)

( * ) Notice: Subject to any disclaimer, the term of this patent is extended or adjusted under 35 U.S.C. 154(b) by 592 days.

(21) Appl. No.: 18/255,248

(22) PCT Filed: Nov. 30, 2021

(86) PCT No.: PCT/NL2021/050723
§ 371 (c)(1),
(2) Date: May 31, 2023

(87) PCT Pub. No.: WO2022/119437
PCT Pub. Date: Jun. 9, 2022

(65) Prior Publication Data
US 2024/0021489 A1 Jan. 18, 2024

(30) Foreign Application Priority Data
Dec. 1, 2020 (NL) ...................................... 2027022

(51) Int. Cl.
*H01L 23/367* (2006.01)
*H01L 23/00* (2006.01)
(Continued)

(52) U.S. Cl.
CPC ........... *H10W 40/22* (2026.01); *H10W 20/20* (2026.01); *H10W 70/65* (2026.01);
(Continued)

(58) Field of Classification Search
CPC . H10W 40/22; H10W 90/701; H10W 90/754; H10W 74/114; H10W 70/65; H10W 20/20
See application file for complete search history.

(56) References Cited

U.S. PATENT DOCUMENTS

| | | | |
|---|---|---|---|
| 5,250,843 A | 10/1993 | Eichelberger | |
| 10,903,182 B1 * | 1/2021 | Wang | H03F 1/0288 |

(Continued)

FOREIGN PATENT DOCUMENTS

| | | |
|---|---|---|
| JP | 2004071961 A | 3/2004 |
| KR | 1020040054286 A | 6/2004 |

OTHER PUBLICATIONS

PCT International Search Report and Written Opinion, Application No. PCT/NL2021/050723, mailed Mar. 3, 2022, 13 pages.

*Primary Examiner* — Peniel M Gumedzoe
(74) *Attorney, Agent, or Firm* — McDonnell Boehnen Hulbert & Berghoff LLP

(57) ABSTRACT

Example embodiments relate to electronic packages and devices that include electronic packages. One example electronic package includes a printed circuit board having a first surface and a second surface. The electronic package also includes a semiconductor die including electronic circuitry integrated thereon. The semiconductor die is mounted on the die pad and has a plurality of terminals for inputting and outputting electrical signals. Additionally, the electronic package includes a body of a solidified molding compound covering the first surface of the printed circuit board and encapsulating the semiconductor die at a first side of the body. The body has a second side opposite to the first side. Further, the electronic package includes a plurality of package terminals arranged on the second side of the body of (Continued)

solidified molding compound. Each package terminal is electrically connected using a conductive structure.

17 Claims, 11 Drawing Sheets

(51) Int. Cl.

| | |
|---|---|
| *H01L 23/31* | (2006.01) |
| *H01L 23/48* | (2006.01) |
| *H01L 23/498* | (2006.01) |
| *H10W 20/20* | (2026.01) |
| *H10W 40/22* | (2026.01) |
| *H10W 70/65* | (2026.01) |
| *H10W 74/10* | (2026.01) |
| *H10W 90/00* | (2026.01) |

(52) U.S. Cl.
CPC ........ *H10W 74/114* (2026.01); *H10W 90/701* (2026.01); *H10W 90/754* (2026.01)

(56) References Cited

U.S. PATENT DOCUMENTS

| | | | |
|---|---|---|---|
| 2008/0315396 A1 | 12/2008 | Kuhlman et al. | |
| 2009/0294947 A1 | 12/2009 | Tain et al. | |
| 2010/0142155 A1 | 6/2010 | Mertol | |
| 2011/0084378 A1 | 4/2011 | Welch et al. | |
| 2013/0026609 A1 | 1/2013 | Wu et al. | |
| 2016/0150632 A1 | 5/2016 | Viswanathan et al. | |
| 2016/0276308 A1 | 9/2016 | Min et al. | |
| 2017/0194281 A1 | 7/2017 | DeLaCruz et al. | |
| 2018/0159479 A1 | 6/2018 | Wu et al. | |
| 2019/0098743 A1* | 3/2019 | Molla | H05K 1/0203 |
| 2019/0173430 A1* | 6/2019 | Krehbiel | H03F 1/0288 |
| 2019/0333878 A1 | 10/2019 | Wu et al. | |

* cited by examiner

ELECTRONIC PACKAGE AND DEVICE COMPRISING THE SAME

CROSS-REFERENCE TO RELATED APPLICATIONS

The present application is a national stage entry of PCT/NL2021/050723 filed Nov. 30, 2021, which claims priority to NL 2027022 filed Dec. 1, 2020, the contents of each of which are hereby incorporated by reference.

The present invention relates to an electronic package. The present invention particularly relates to radiofrequency, 'RF', packages. The present invention further relates to an electronic device comprising such a package.

Electronic packages are known in the art. An example of a known molded RF power amplifier package 600 is shown in cross section in FIG. 1A. Package 600 comprises a printed circuit board 610 having a first surface 611 and a second surface 612 opposing first surface 611. Printed circuit board 610, which may be embodied as a multilayer board, comprises a plurality of metal traces 613 that are arranged on first surface 611. A semiconductor die 620 comprising electronic circuitry 626 integrated thereon is mounted on first surface 611. Electronic circuitry 626 has a plurality of terminals 623 for inputting and outputting electrical signals. Each terminal 623 is electrically connected, using one or more bondwires 624, to a metal trace 613 among the plurality of metal traces 613.

A copper coin 614 is arranged inside printer circuit board 610 to efficiently remove heat that is generated inside electronic circuitry 626. For example, electronic circuitry 626 may comprise an RF power field-effect transistor, 'FET', based on silicon laterally diffused metal-oxide-semiconductor, 'LDMOS', transistor technology or gallium nitride FET technology. It is noted that for these technologies, grounding is usually achieved through coin 614. More in particular, the backside of semiconductor die 620 with which semiconductor die 620 is mounted on coin 614 is provided with a metal layer that is electrically connected to the source of the power FET. Such connection is made possible through the use of vias through the substrate of semiconductor die 620 or the substrate itself may be electrically conducting.

On second surface 612 a plurality of package terminals are provided in the form of pads 640 that are connected to metal traces 613 using vias 616. In addition, a central pad 641 may be provided that is connected to coin 614.

Package 600 further comprises a body 630 of a solidified molding compound covering first surface 611 of printed circuit board 610 and encapsulating semiconductor die 620 at a first side 631 of body 630, wherein body 630 further has a second side 632 opposite to first side 631.

As shown in FIG. 1B, package 600 can be mounted on a further printed circuit board 710 to form an electronic device 700. In FIG. 1B, printed circuit board 710 comprises a first layer 710A and a second layer 710B. Metal traces 711 may be provided on top of first layer 710A and inner metal traces 712 may be provided between layer 710A and layer 710B. Contact between traces 711, 712 is possible through vias 711A.

As shown in FIG. 1B, package 600 is mounted to printed circuit board 710 such that pads 640, 641 make contact, e.g. by means of soldering, to corresponding pads or other parts of metal traces 711.

As shown, a coin 714 or other heat conducting member is arranged inside printed circuit board 710 to allow the heat generated inside electronic circuitry 626 to be transported away for instance by using a heatsink on the backside of printed circuit board 710.

A problem with electronic devices such as the electronic device shown in FIG. 1B is that the effective removal of heat from package 600 requires a relatively complex and costly printed circuit board 710. Furthermore, most often, package 600 is manufactured by a different company than the manufacturer of electronic device 700.

It is an object of the present invention to provide an electronic package having a different assembly and/or configuration to allow the electronic package to be mounted on a less costly or complex printed circuit board for the manufacturing of an electronic device.

This object is achieved using the electronic package as defined in claim 1 which is characterized in that each package terminal among the plurality of package terminals is arranged on the second side of the body of solidified molding compound and is connected to a respective metal trace using an embedded bondwire that extends through the body of solidified molding compound. In addition, the electronic package further comprises a heatsink that is fixedly connected to the second surface of the printed circuit board.

Compared to electronic package 600 shown in FIG. 1A, the electronic package according to the present invention is configured to be arranged on a printed circuit board of an electronic device in an upside down manner. Instead of the package terminals being arranged on the printed circuit board, the package terminals in the electronic package of the present invention are arranged on the body of solidified molding compound. Connections to the package terminals are obtained using embedded bondwires. It is noted that the technology for obtaining embedded bondwires is known in the art for example from U.S. Pat. No. 9,984,992B2.

Furthermore, compared to electronic package 600 shown in FIG. 1A, according to the present invention heat is transported in a direction away from the printed circuit board on which the electronic package is or is to be mounted. More in particular, the heatsink arranged on the printed circuit board of the electronic package transfers the heat generated in the electronic circuitry to the surroundings, e.g. by means of air convection either forced or unforced. In this manner, there is no longer a need for providing a coin or other heatsink inside the printed circuit board of the electronic device on which the electronic package of the present invention is or is to be mounted. The printed circuit board of the electronic package may comprise a coin arranged in between the heatsink and the semiconductor die that is configured for transporting heat away from the semiconductor die towards the heatsink. Alternatively, the printed circuit board of the electronic package may be provided with a plurality of thermal vias extending in the printed circuit board and arranged in between the heatsink and the semiconductor die.

The semiconductor die may comprise a first surface and a second surface opposing the first surface, wherein the terminals of the semiconductor die are formed on the second surface. A package terminal among the plurality of package terminals may be configured as a package ground terminal for providing a ground reference voltage to the electronic circuitry during use. Additionally or alternatively, at least one terminal of the semiconductor die may be electrically coupled to a respective metal trace using one or more bondwires.

The terminals of the semiconductor die may include a ground terminal that is configured to be electrically grounded during use for providing a ground reference voltage to the electronic circuitry. This ground terminal is electrically connected to the package ground terminal.

Alternatively, during use, a ground reference voltage may be provided to the electronic circuitry through vias in the semiconductor die or through a substrate of the semiconductor die that is electrically conductive. In this case, the printed circuit board may comprise a metal layer arranged on the second surface of the printed circuit board that preferably covers substantially the entire second surface. The printed circuit board may also comprise a via that is laterally spaced apart from the semiconductor die and that extends through the printed circuit board from the metal layer on the second surface of the printed circuit board to the metal trace arranged on the first surface of the printed circuit board that is connected to the package ground terminal. Alternatively, the printed circuit board can be a multilayer printed circuit board having an inner metal layer that is electrically connected to the coin or the plurality of thermal vias and that laterally extends beyond the semiconductor die. In this case, the printed circuit board may further comprise a via laterally spaced apart from the semiconductor die and that extends through at least part of the printed circuit board from the inner metal layer to the metal trace that is connected to the package ground terminal. It should be noted that the abovementioned metal layer that is arranged on the second surface of the printed circuit board and that preferably covers substantially the entire second surface of the printed circuit board can be used regardless how the ground reference voltage is supplied to the electronic circuitry. For example, such metal layer may aid in mounting the heatsink to the printed circuit board and it may provide heat spreading and/or heat conducting properties.

An important example of the abovementioned grounding includes the source contact of an RF power FET that may be included in the electronic circuitry.

The semiconductor die may be mounted with its first surface to the first surface of the printed circuit board. Alternatively, each terminal of the semiconductor die may comprise a ball of a ball grid array with which the semiconductor die is flip-chip mounted on the first surface of the printed circuit board.

The heatsink may be connected to the second surface of the printed circuit board using thermal paste. Additionally or alternatively, the heatsink may comprise a heatsink base and a plurality of fins extending from the heatsink base.

The electronic package may comprise one or more surface mount devices mounted to the first surface of the printed circuit board. These one or more surface mount devices form, together with the one or more metal traces or parts thereof, one or more passive circuits. At least one passive circuit among the one or more passive circuits may be connected to a respective package terminal using an embedded bondwire. Examples of a passive circuit include an impedance matching circuit or a biasing circuit.

The electronic package may further comprise a fence of embedded bondwires arranged around the perimeter of the semiconductor die. Such fence may electromagnetically shield the electronic circuitry on the semiconductor die from other circuitry in the package. Such shielding may for example be important when the electronic package includes a multi-stage amplifier wherein a first stage is integrated on a first semiconductor die and a final stage on another semiconductor die. In such case, feedback from the output of the final stage to the first stage may be prevented by arranging a fence of embedded wires around the semiconductor die on which the final stage is integrated. Furthermore, if multiple stages are integrated on a single semiconductor die, arranging a fence of embedded bondwires around the perimeter of this semiconductor die could prevent or limit feedback between the output of the last stage and the input of the first stage.

The electronic package may also comprise a central pad arranged on the second side of the body of solidified molding compound. In this case, the package terminals can be arranged in a perimeter region of the second side of the body of solidified molding compound spaced apart from the central pad. The central pad may aid the mounting of the electronic package on the printed circuit board of the electronic device. Such central pad, even though the central pad may not be electrically connected to the electronic circuitry, may enable the pad layout on the second side of the body of solidified molding compound to be similar to that of existing electronic packages. Such requirement can be important for the reliability of the soldered connection between the electronic package and the printed circuit board of the electronic device.

A configuration of a central pad and a plurality of pads around the perimeter may form a so-called land grid array, 'LGA'. Instead of an LGA, the package terminals may comprise a plurality of balls for forming a ball grid array on the second side of the body of solidified molding compound. These balls may be provided on the abovementioned pads.

The electronic circuitry may comprise an RF power FET, such as a gallium nitride based FET or a silicon based LDMOS transistor. The electronic package may comprise a Doherty amplifier of which a main amplifier and/or peak amplifier are integrated on the semiconductor die, wherein the main amplifier and the peak amplifier each comprise a respective RF power FET. Furthermore, the electronic package may comprise a plurality of said semiconductor dies, wherein the main and peak amplifiers are arranged on different semiconductor dies among said plurality of semiconductor dies. Alternatively, the main and peak amplifier may be arranged on a single semiconductor die.

The Doherty amplifier may comprise a Doherty combiner that is formed using the parasitic output capacitance of the main and peak amplifier and a metal trace or bondwire connecting outputs of the main and peak amplifiers. In this manner, a C-L-C network may be formed of which the parasitic capacitances of the main and peak amplifier form, at least in a large part, shunt capacitances to ground. The metal trace may in this case form the series inductance of the C-L-C network. The C-L-C network forms an equivalent of a quarter wavelength impedance transformer, at least at a frequency of interest lying in or near to an operational frequency range of the electronic package. Alternatively, a Doherty combiner may be formed using a metal trace that forms a quarter wavelength impedance transformer at these frequencies.

The electronic package may further comprise a further semiconductor die comprising a driver for the Doherty amplifier.

According to a second aspect, the present invention may provide an electronic device that comprises a printer circuit board with a plurality of pads. The electronic device may further comprise the electronic package as described above of which the package terminals are each connected to a pad among the plurality of pads.

Next, the present invention will be described in more detail, wherein identical reference signs are used to refer to the identical or similar components and wherein.

Figure 2A:
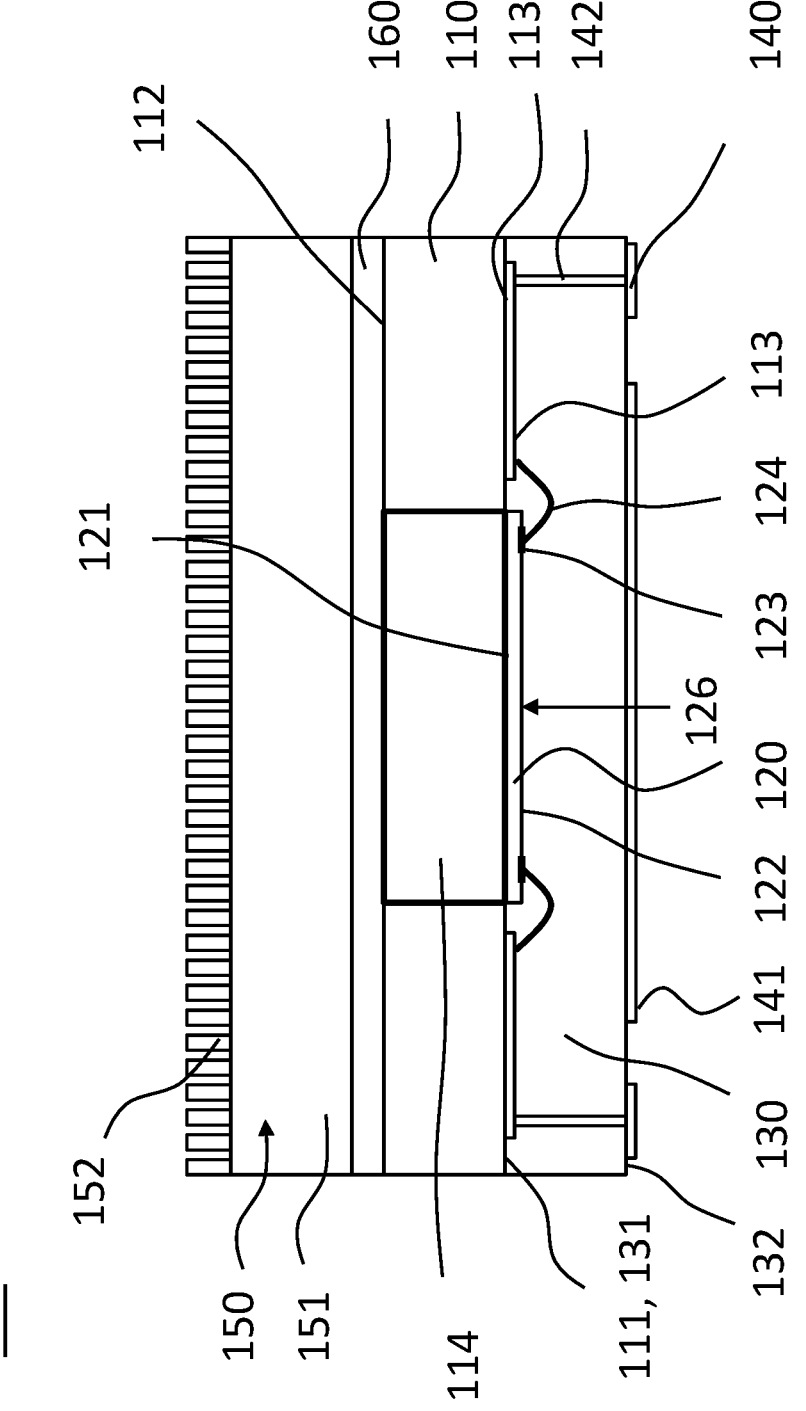
FIG. 2A illustrates a first example of an electronic package in accordance with the present invention in which a coin is used for transporting heat away from the electronic circuitry.

FIG. 2A is a first example of an electronic package 100 that comprises a printed circuit board 110 in which a coin 114 is arranged. On a first surface 111 of printed circuit board 110, metal traces 113 are provided. Furthermore, a semiconductor die 120 having a first surface 121 and a second surface 122 is mounted with its first surface 121 on printed circuit board 120. More in particular, semiconductor die 120 is mounted on coin 114.

On semiconductor die 120 electronic circuitry 126 is provided. Semiconductor die 120 comprises terminals 123 for inputting and outputting electrical signals. Terminals 123, such as pads, bondpads, or bondbars, are each connected to a metal trace 113 using one or more bondwires 124. To this end, metal traces 113 may comprise pads, such as bondpads, or the like.

On a second surface 112 of printed circuit board 110 a thermal paste 160 is provided to fixedly connect a heatsink 150 to printed circuit board 110. Heatsink 150 comprises a heatsink base 151 and a plurality of fins 151 that each extend away from heatsink base 151 to allow efficient cooling by means of convection, either forced or unforced.

On first surface 111, a body 130 of solidified molding compound covers, at a first side 131 thereof, semiconductor die 120, bondwires 124, and metal traces 113. At a second side 132 of body 130, a plurality of package terminals is formed in the shape of pads 140. Each pad 140 is connected to a respective metal trace 113 using an embedded bondwire 142 that extends through body 130 of solidified molding compound. In addition to pads 140, a central pad 141 is provided that has no electrical connection to electronic circuitry 126 on semiconductor die 120. Together, central pad 141 and pads 140 form a land grid array, 'LGA'.

In the example of FIG. 2A, heat is transported away from semiconductor die 120 in a direction away from body 130 of solidified molding compound. Furthermore, one terminal among terminals 123 constitutes a so-called ground terminal that, at least during use, provides a ground reference voltage to electronic circuitry 126 on semiconductor die 120. This ground terminal is connected, via one or more bondwires 124, to a metal trace that in turn is connected to a package terminal 140. This latter terminal is referred to as package ground terminal. The ground terminal on semiconductor die 120 can for example be connected to the source of an RF power FET that can be part of electronic circuitry 126 on semiconductor die 120.

Figure 2B:
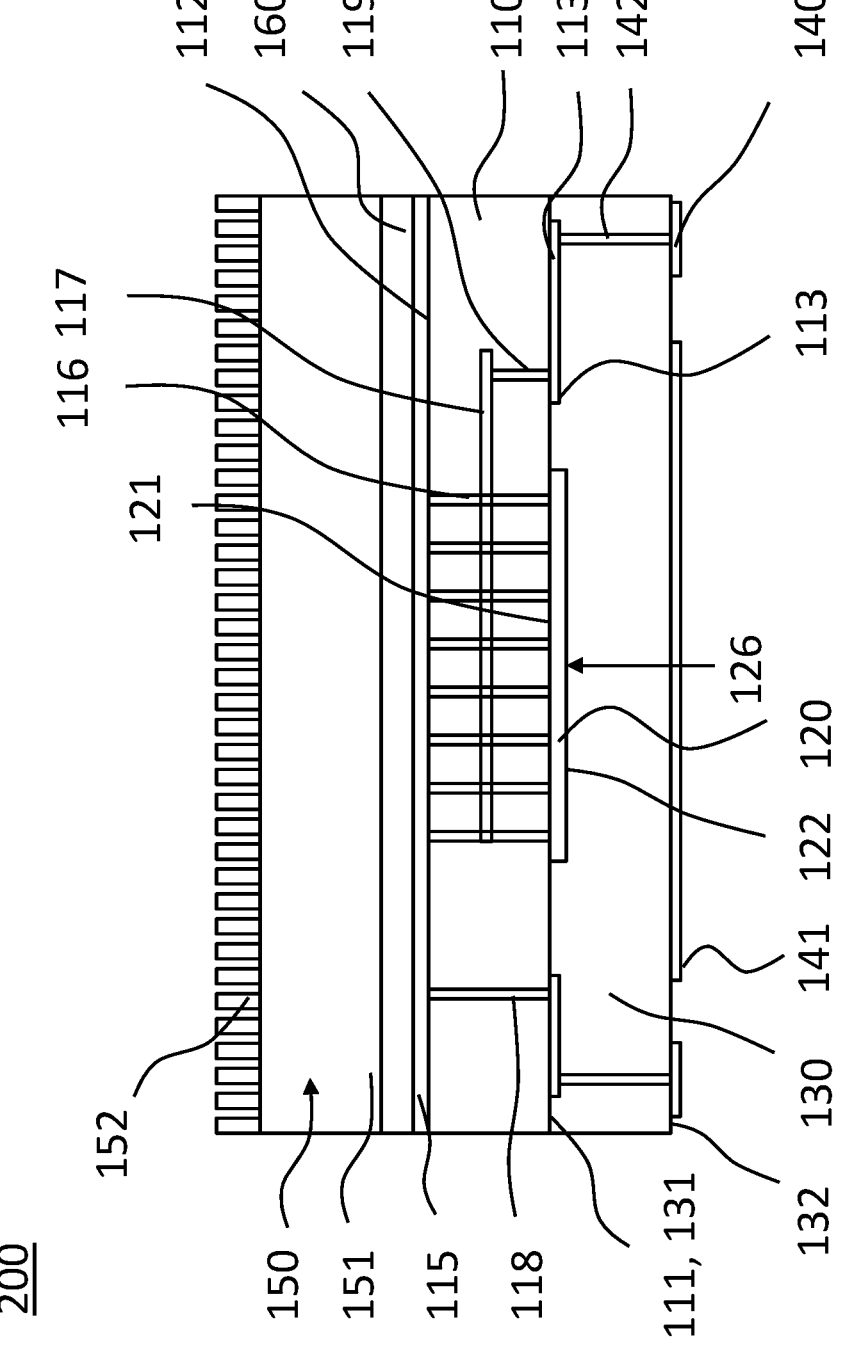
FIG. 2B illustrates a second example of an electronic package in accordance with the present invention in which a plurality of thermal vias is used for transporting heat away from the electronic circuitry.

Package 200 shown in FIG. 2B shows a further example in which coin 114 is replaced by a plurality of thermal vias 116 that electrically connect first surface 121 semiconductor die 120, which may be provided with one or more metals, to a metal layer 115 that is arranged in between printed circuit board 110 and thermal paste 160. Furthermore, printed circuit board 110 is a multilayer board having an inner metal layer 117.

In FIG. 2B, two other options for providing a ground reference voltage to electronic circuitry 126 are shown. On the left in FIG. 2B, it is shown that the ground reference voltage is provided via package ground terminal 140, embedded bondwire 142, metal trace 113, via 118, metal layer 115, and thermal via 116. On the right in FIG. 2B, it is shown that the ground reference voltage is provided via package ground terminal 140, embedded bondwire 142, metal trace 113, via 119, inner metal layer 117, and thermal via 116. It should be noted that the connection shown on the left hand side can also be used in case printed circuit board 120 only comprises a single dielectric layer.

Figure 3:
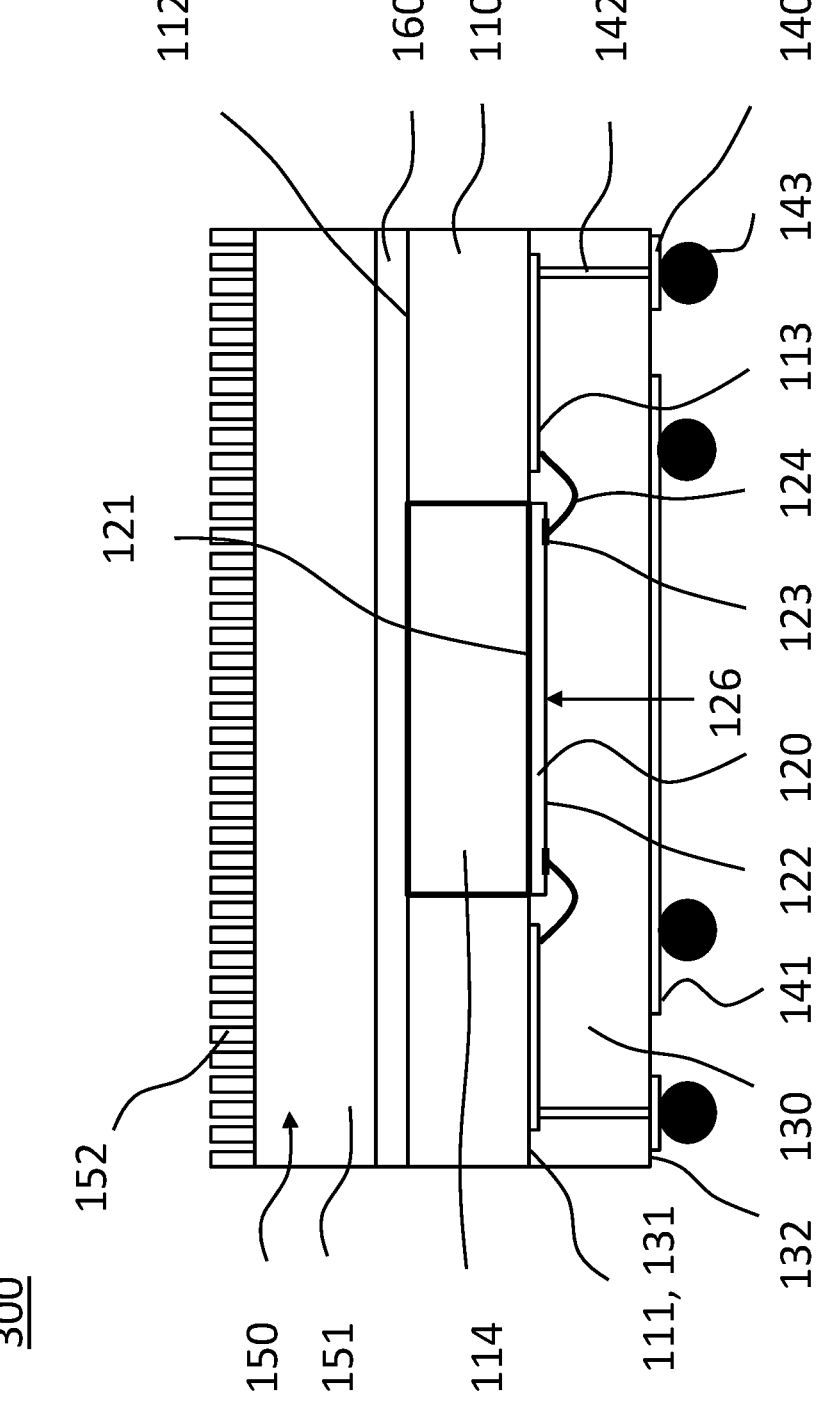
FIG. 3 is a third example of an electronic package in accordance with the present invention wherein a ball grid array is formed on the body of solidified molding compound.
Figure 4:
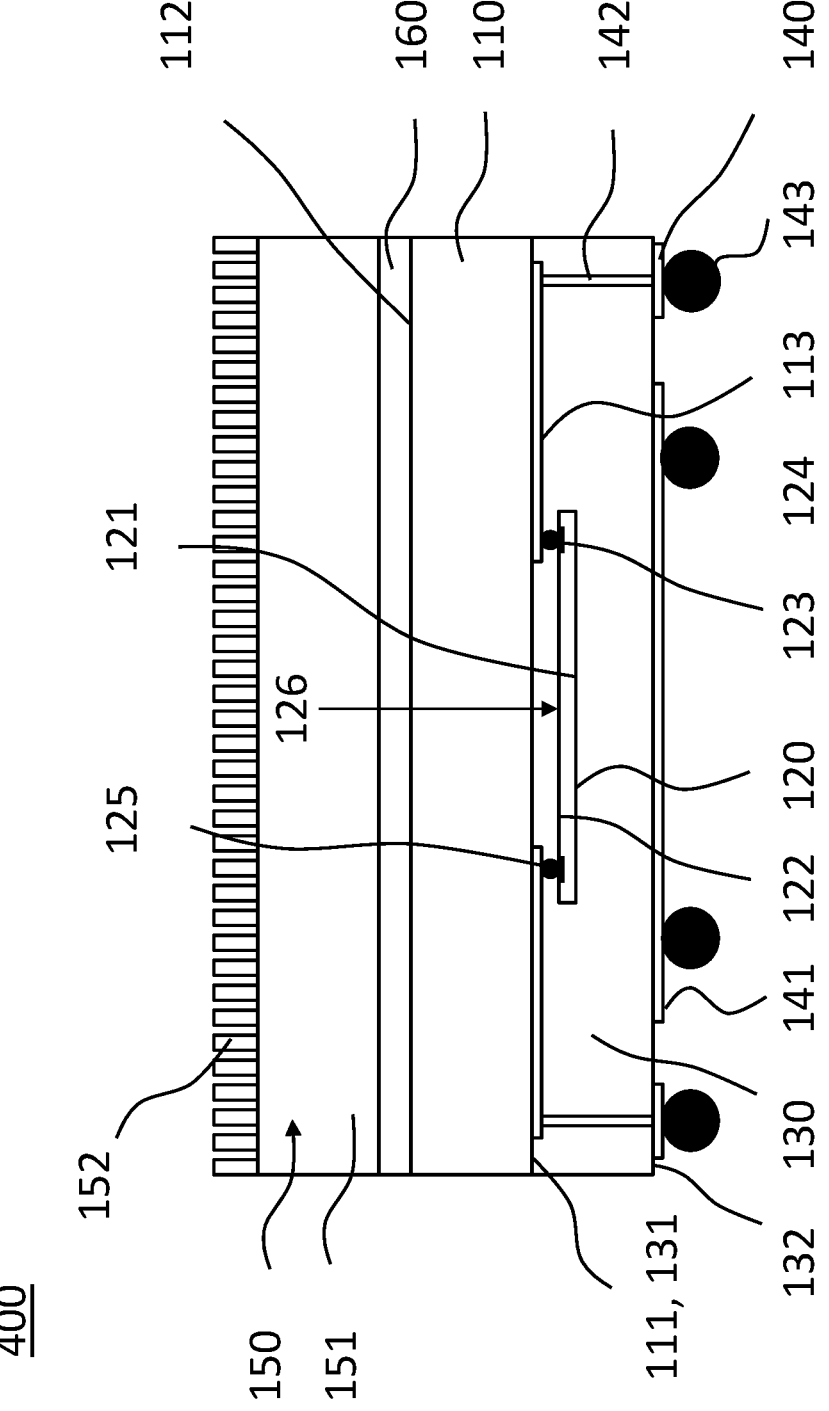
FIG. 4 is a fourth example of an electronic package in accordance with the present invention wherein a ball grid array is formed and wherein the semiconductor die is flip-chip mounted.

In FIG. 3, a package 300 is shown in which solder balls 143 are provided on top of pads 140, 141. In this manner, a ball grid array is formed for mounting electronic package 300. As shown in FIG. 4, it is also possible to mount semiconductor die 120 using a flip-chip technique. In this case, the terminals on semiconductor die 120 comprise balls 125 that are arranged on pads 123. It is furthermore noted that mounting semiconductor die 120 in a flip-chip manner as shown in FIG. 4 can also be used in electronic packages having a land grid array as shown in FIG. 2A.

Figures 1A, 1B:
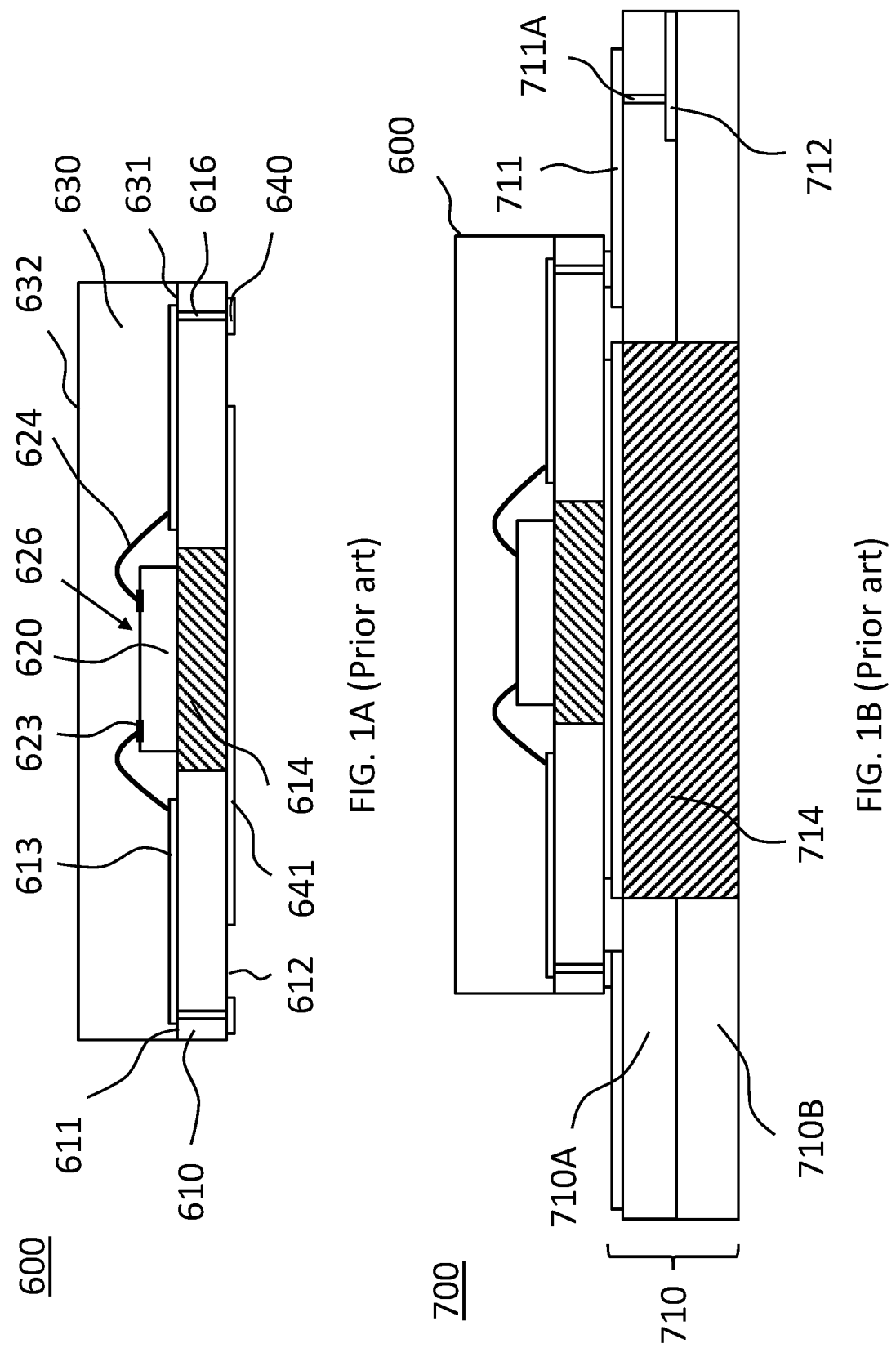
FIGS. 1A and 1B illustrate a known electronic package and a known electronic device comprising such electronic package, respectively.
Figure 5:
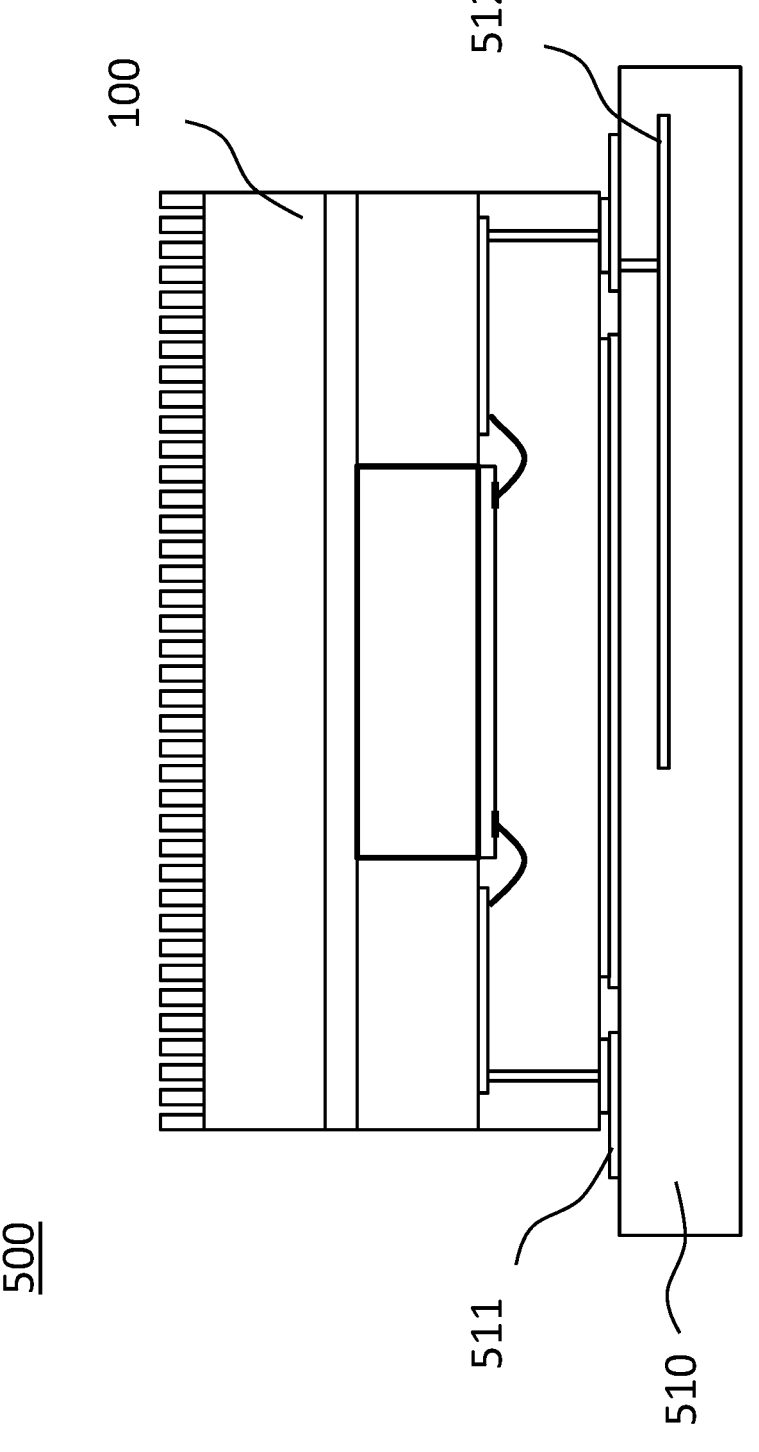
FIG. 5 is an example of an electronic device in accordance with the present invention comprising the electronic package of FIG. 2A.

FIG. 5 illustrates an embodiment of an electronic device 500 in accordance with the present invention. In FIG. 5, an electronic package such as electronic package 100 is mounted to a printed circuit board 510. Printed circuit board 510 can be a multilayer board having inner metal layers 512. Furthermore, pads 511 are formed on an upper surface for mounting electronic package 100 for example using soldering. Comparing electronic device 500 to electronic device 700 shown in FIG. 1B it can be noted that it is no longer needed to provide a coin or other heat conducting means in printed circuit board 510 as the heat generated in electronic package 100 is transported in a direction away from printed circuit board 510. As such, the requirements for printed circuit board 510 can be less stringent than for the electronic device in FIG. 1B reducing the overall costs for the materials and processing of electronic device 500.

Figure 6A:
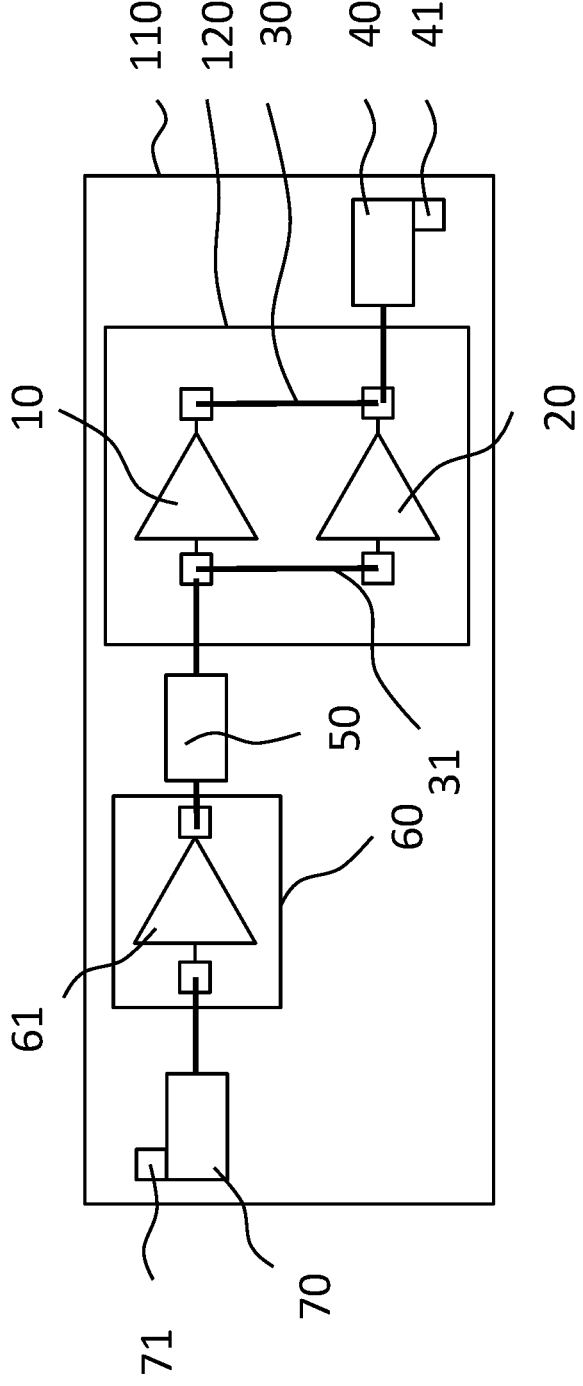
FIG. 6A is a fifth example of an electronic package in accordance with the present invention wherein an integrated Doherty with a driver stage is formed inside the package.

FIG. 6A illustrates a part of an electronic package in accordance with the present invention. This figure illustrates printed circuit board 110 on which two semiconductor dies 60, 120 are mounted. On semiconductor die 120 a main amplifier 10 and a peak amplifier 20 of a Doherty amplifier are integrated. Each of these amplifiers comprises an RF power FET such as a silicon based LDMOS transistor or a gallium nitride based FET. Furthermore, one or more bondwires 31 are connected in between inputs of main amplifier 10 and peak amplifier 20 for realizing a Doherty splitter. Together with the parasitic input capacitances of main amplifier 10 and peak amplifier 20, a C-L-C network is formed that mimics the behavior of a 90 degrees phase shifter. If needed, additional capacitances, such as metal-insulator-metal capacitors may be provided on semiconductor die 120 in case the parasitic capacitances are not sufficient.

Similarly, at the output, one or more bondwires 30 are connected in between outputs of main amplifier 10 and peak amplifier 20 for realizing a Doherty combiner. Bondwire(s) 30 form(s), together with the parasitic output capacitances of main amplifier 10 and peak amplifier 20 a C-L-C network that mimics the behavior of a quarter wave impedance transformer at a frequency of interest in or near an operational frequency range of the electronic package. Again, additional capacitors could be used if the parasitic capacitances are insufficient for realizing the required C-L-C network. Such capacitors could be connected in between ground and the output of main amplifier 10 and peak amplifier 20.

The Doherty amplifier formed on semiconductor die 120 is driven by a driver 61 that is integrated on semiconductor die 60. Such driver may also comprise an RF power FET as described above. An inter-stage matching network 50 may be provided on printed circuit board 110 for providing an impedance match between an output of driver 61 and an input of the Doherty amplifier. Such inter-stage matching network 50 may comprise one or more metal traces, e.g. for realizing inductors, and one or more surface mount devices, e.g. for realizing capacitors.

An input matching network 70 may be provided in between input terminal 71 and an input of driver 61. Similarly, an output matching network 40 may be provided in between the combining node of the Doherty amplifier, i.e. the node at which bondwire(s) 30 are connected to the output of peak amplifier 20, and output terminal 41. Similar to inter-stage matching network 50, input matching network 70 and output matching network 40 may each comprise metal traces and surface mount devices. Furthermore, input terminal 71 and output terminal 41 are each connected to a respective package terminal using one or more embedded bondwires.

Figure 6B:
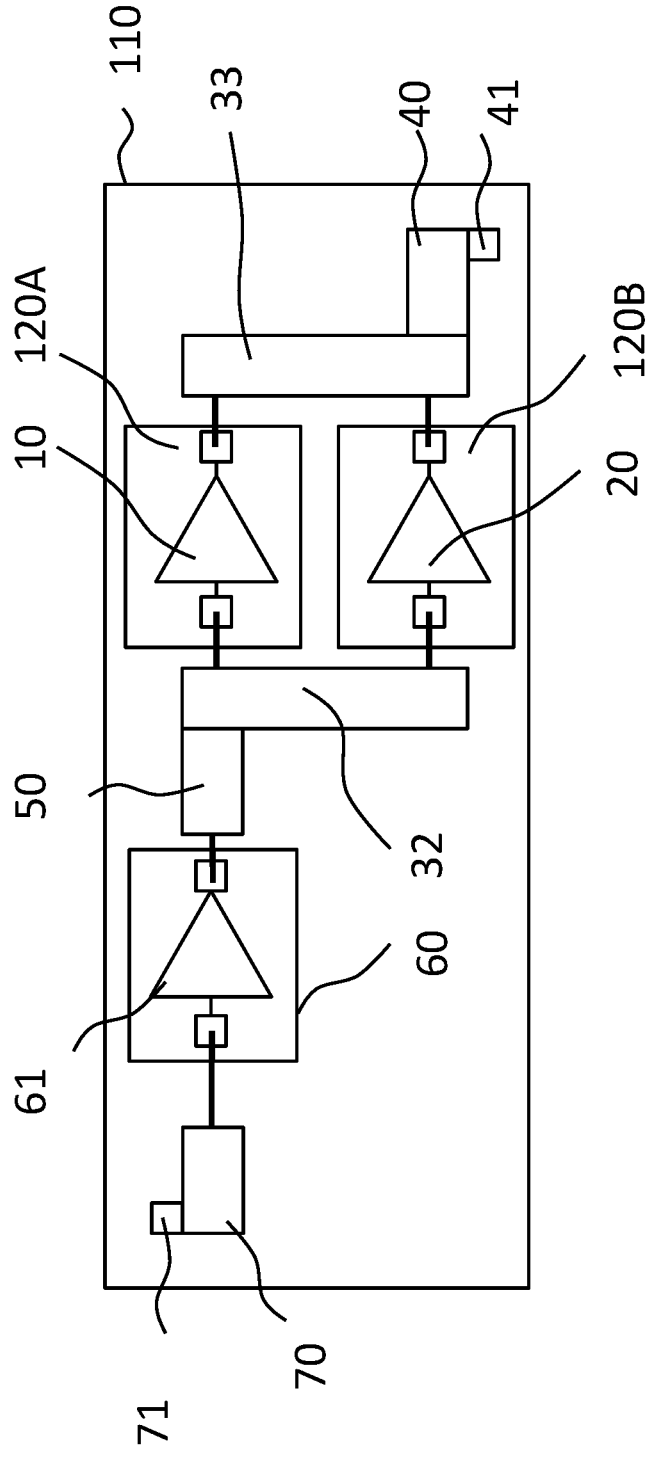
FIG. 6B is a sixth example of an electronic package in accordance with the present invention wherein a Doherty with a driver stage is formed inside the package.

FIG. 6B illustrates a part of a further electronic package in accordance with the present invention. Compared to the package shown in FIG. 6A, in the electronic package shown in FIG. 6B, Doherty splitter 32 and Doherty combiner 33 are realized off-chip. More in particular, these elements are realized using metal traces, for example in the form of a quarter wavelength transmission line, optionally coupled to one or more surface mount devices such as capacitors. Furthermore, main amplifier 10 is arranged on semiconductor die 120A whereas peak amplifier 20 is arranged on a different semiconductor die 120B.

Figure 7B:
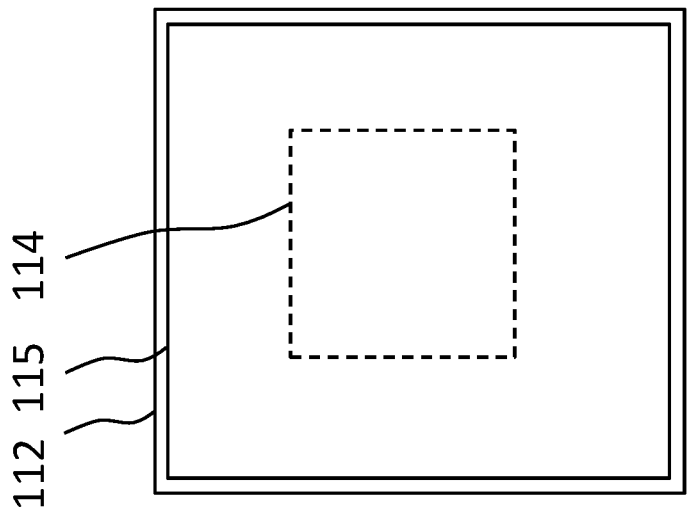
FIGS. 7A and 7B illustrate the metal arrangement at the bottom side of the electronic package and at the interface between the printed circuit board and the heatsink or thermal paste, respectively.
Figure 7A:
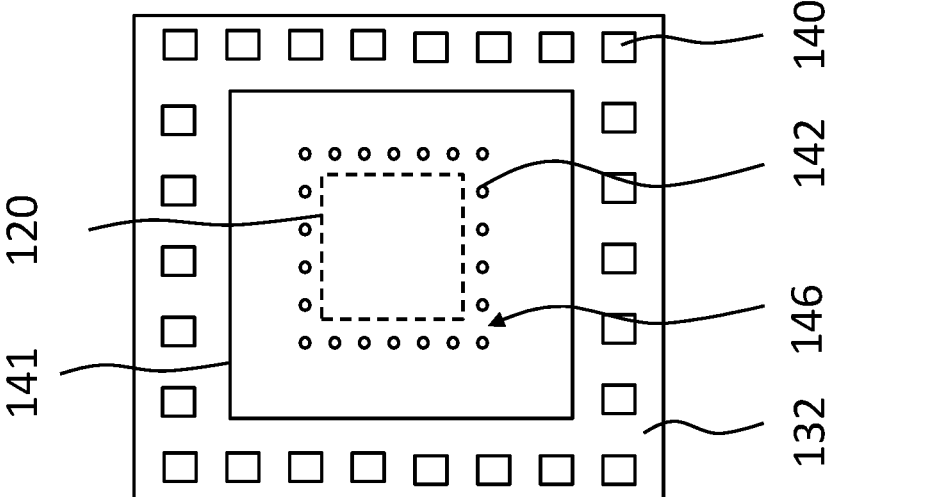

FIG. 7A illustrates an exemplary arrangement of metal pads 140 on second surface 132 of the body of solidified molding compound in accordance with the present invention. As shown, metal pads 140 are arranged in a perimeter region of second surface 132 of the body of solidified molding compound. In addition, a metal central pad 141 is provided that is spaced apart from pads 140.

FIG. 7A also illustrates, in dashed lines, semiconductor die 120 that is surround by a fence 146 of embedded bondwires 142. Fence 146 is connecting the ground of the electronic circuitry that is arranged on semiconductor die 120 to metal central pad 141, which is, in this case, also a ground pad. Such fence may provide electromagnetic shielding for the electronic circuitry such that this circuitry is not influenced by or influences other circuitry that is arranged outside fence 146. Such fence could for instance be arranged around semiconductor die 120 in FIG. 6A to prevent signal leakage from the output of the Doherty amplifier back to driver 61. Moreover, grounding of the electronic circuitry on semiconductor die 120 can be achieved using one or more bondwires extending between semiconductor die 120 and one or more pads on printed circuit board 110. From these pads or tracks connected thereto, embedded bondwires may extend to metal central pad 141 and/or one or more metal pads 140.

Furthermore, although FIG. 7A illustrates metal central pad 141 as having a pad shape, the present invention equally relates to other shapes. For example, a ring shape could be used. Typically, metal central pad 141, regardless of its shape, is used as a ground terminal among the package terminals of the electronic package.

FIG. 7B illustrates an exemplary arrangement of a large metal layer 115 on second surface 112 of printed circuit board 110 in accordance with the present invention. Metal layer 115 allows efficient heat spreading and heat conducting between coin 115 and thermal paste 160 that is arranged on metal layer 115.

In the embodiments above where semiconductor die 120 is mounted with its first surface to first surface 111 of printed circuit board 110, a die pad may be provided on printed circuit board 110. Such die pad is typically formed by the upper metal layer of printed circuit board 110 and has a shape that is larger than the footprint of semiconductor die 120. When a coin is used inside printed circuit board 110, as illustrated in FIG. 2A, the coin may be fixedly connected to the die pad and/or may partially form the die pad. If a plurality of thermal vias is used, as illustrated in FIG. 2B, the thermal vias will connect the die pad to metal layer 115.

The die pad may be connected to a metal trace 113 that is connected, using an embedded wire 142, to a package ground terminal. Alternatively, the die pad may be connected directly to such terminal using an embedded wire 142 provided the die pad extends to a position above that terminal.

Figure 8A:
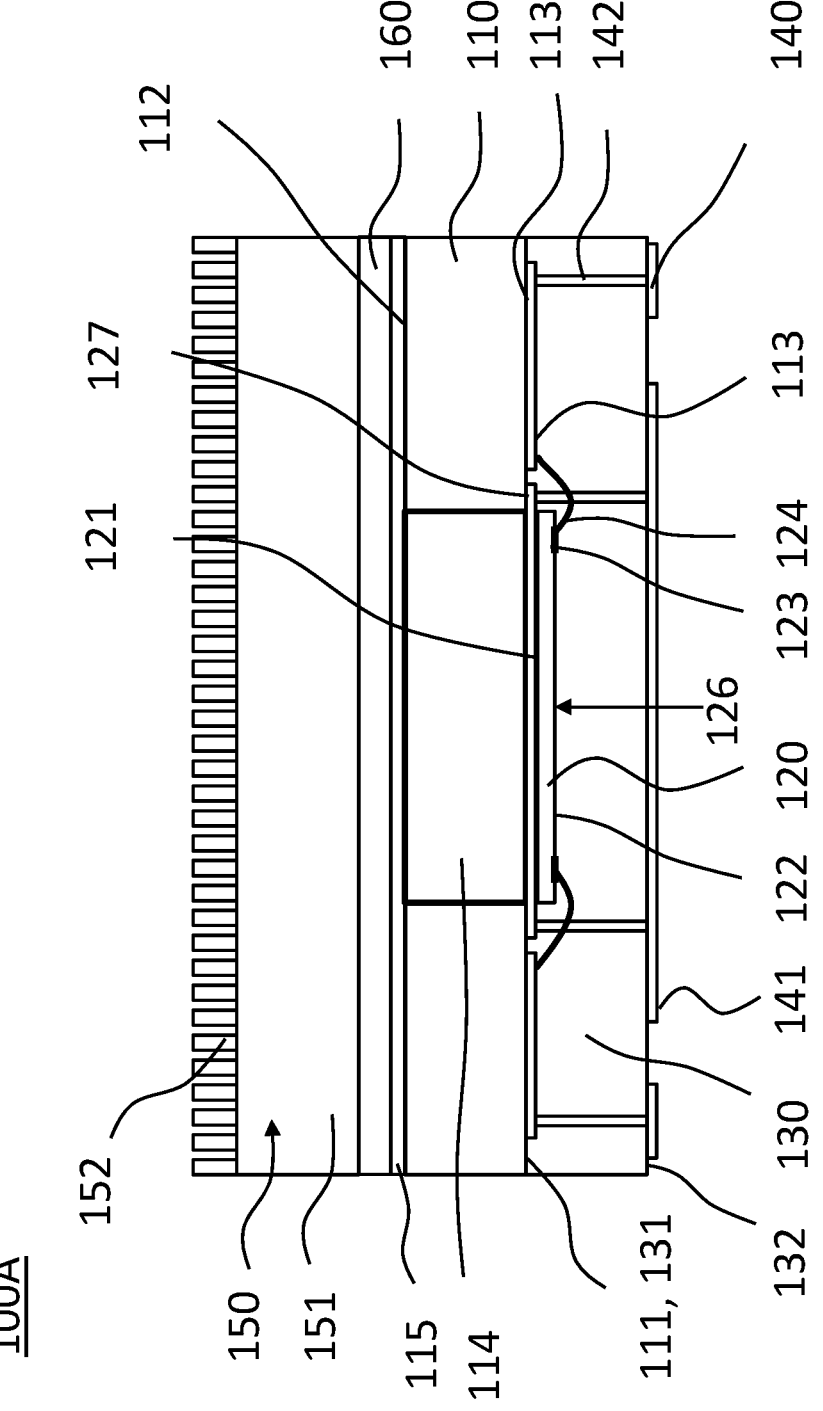
FIGS. 8A and 8B illustrate further examples of an electronic package in accordance with the present invention based on the examples of FIGS. 2A and 2B, respectively, wherein a die pad is used.
Figure 8B:
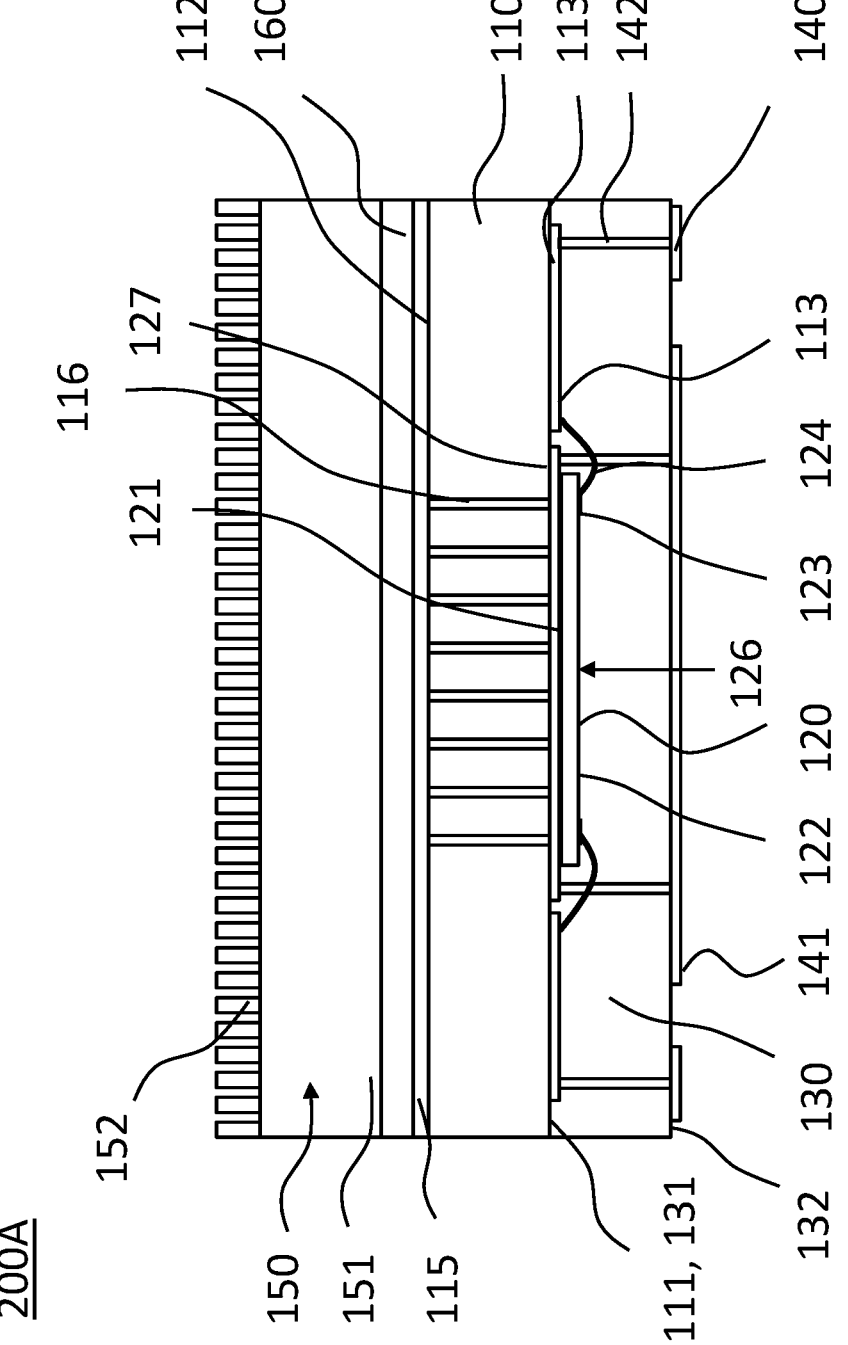

As stated above, a fence 146 can be used for connecting the ground of the electronic circuitry that is arranged on semiconductor die 120 to a metal central pad 141. When a die pad is used, embedded bondwires 142 of fence 146 may extend between the die pad and metal central pad 141. This is illustrated in FIGS. 8A and 8B that depict examples of an electronic package 100A, 200A in accordance with the present invention based on the examples of FIGS. 2A and 2B, respectively, wherein a die pad is used. As shown, semiconductor die 120 is arranged with its first surface 121 on die pad 127. This latter pad is connected using an embedded wire 142 to metal central pad 141, wherein this latter pad is configured to be grounded during use. In this case, a ground reference is provided via metal central pad 141, embedded bondwires 142 of fence 146, die pad 127, the conductive substrate of semiconductor die 120 or the vias in the substrate of semiconductor 120, to the electronic circuitry on semiconductor die 120. Instead of a fence 146, one more embedded wires 142 may be used. It is furthermore noted that bondwires 124 and embedded wires 142 are arranged spaced apart to prevent short-circuiting. Furthermore, the backside of the electronic packages shown in FIGS. 8A and 8B may correspond to that shown in FIG. 7A.

In the above, the present invention has been explained using detailed embodiments thereof. However, the present invention is not limited to these embodiments and several modifications are possible without deviating from the scope of the present invention that is defined by the appended claims. For example, in some embodiments for which the cooling requirements are less stringent due to the fact that less heat is generated in the electronic circuitry on the semiconductor die, the heatsink may be omitted. In such case, the heat can be sufficiently removed using the metal layer that is arranged on the second surface of the printed circuit board of the electronic package. Optionally, even this latter metal layer may be omitted. Additionally or alternatively, instead of embedded bondwires, other conductive structures, such as copper pillars, may be used for connecting each package terminal through the body of solidified molding compound to a respective metal trace arranged on the first surface of the printed circuit board.

| REFERENCE SIGNS | |
| --- | --- |
| 10 | main amplifier |
| 20 | peak amplifier |
| 31 | bondwire |
| 32 | Doherty splitter |
| 33 | Doherty combiner |
| 40 | output matching network |
| 41 | output terminal |
| 50 | inter-stage matching network |
| 60 | semiconductor die |
| 61 | driver |
| 70 | input matching network |
| 71 | input terminal |
| 100, 100A | electronic package |
| 110 | printed circuit board |
| 111 | first surface printed circuit board |
| 112 | second surface printed circuit board |
| 113 | metal trace |
| 114 | coin |
| 115 | metal layer on second surface printed circuit |
| 116 | thermal via |
| 117 | inner metal layer printed circuit board |
| 118 | via |
| 119 | via |
| 120, 120A, 120B | semiconductor die |
| 121 | first surface semiconductor die |
| 122 | second surface semiconductor die |
| 123 | terminal electronic circuitry |
| 124 | bondwire |
| 125 | ball |
| 126 | electronic circuitry |
| 127 | die pad |
| 130 | body solidified molding compound |
| 131 | first side body solidified molding compound |
| 132 | second side body solidified molding compounds |
| 140 | package terminal |
| 141 | central pad |
| 142 | embedded bondwire |
| 143 | ball |
| 146 | fence |
| 150 | heatsink |
| 151 | heatsink base |
| 152 | fins |
| 200, 200A | electronic package |
| 300 | electronic package |
| 400 | electronic package |
| 500 | electronic device |
| 510 | printed circuit board |
| 511 | pad |
| 512 | inner metal layer |
| 600 | electronic package (prior art) |
| 610 | printed circuit body |
| 611 | first surface printed circuit board |
| 612 | second surface printed circuit board |
| 613 | metal trace |
| 614 | coin |

-continued

| REFERENCE SIGNS | |
| --- | --- |
| 616 | via |
| 620 | semiconductor die |
| 623 | terminal |
| 624 | bondwire |
| 626 | electronic circuitry |
| 630 | body solidified molding compound |
| 631 | first side body solidified molding compound |
| 632 | second side body solidified molding compound |
| 640 | package terminal |
| 641 | central pad |
| 700 | electronic device (prior art) |
| 710 | printed circuit board |
| 710A | first dielectric layer |
| 710B | second dielectric layer |
| 711 | metal trace |
| 711A | via |
| 712 | inner metal trace |
| 714 | coin |

The invention claimed is:

1. An electronic package, comprising:

a printed circuit board having a first surface and a second surface opposing the first surface, said printed circuit board comprising a plurality of metal traces arranged on the first surface, the plurality of metal traces comprising a die pad;

a semiconductor die comprising electronic circuitry integrated thereon, said semiconductor die being mounted on the die pad and having a plurality of terminals for inputting and outputting electrical signals, wherein each terminal is electrically connected to a metal trace among the plurality of metal traces, wherein the semiconductor die comprises a first surface and a second surface opposing the first surface, wherein the semiconductor die is mounted with its first surface to the first surface of the printed circuit board, wherein the terminals of the semiconductor die are formed on the second surface of the semiconductor die, wherein at least one terminal of the semiconductor die is electrically coupled to a respective metal trace using one or more bondwires, the semiconductor die comprising a conductive substrate or a substrate that is provided with vias for connecting ground of the electronic circuitry to the die pad, and wherein the electronic circuitry comprises a radiofrequency (RF) power field-effect transistor (FET);

a body of a solidified molding compound covering the first surface of the printed circuit board and encapsulating the semiconductor die at a first side of the body, said body having a second side opposite to the first side; and a plurality of package terminals arranged on the second side of the body of solidified molding compound, wherein each package terminal is electrically connected using a conductive structure that extends through the body of solidified molding compound, to a respective metal trace among the plurality of metal traces, wherein the plurality of package terminals comprises a central pad and remaining package terminals, wherein the remaining package terminals are arranged in a perimeter region of the second side of the body of solidified molding compound spaced apart from the central pad, wherein the die pad has a shape that is larger than a footprint of the semiconductor die, wherein the electronic package further comprises a heatsink that is fixedly connected to the second surface of the printed circuit board, wherein:

the printed circuit board comprises a coin arranged in between the heatsink and the semiconductor die, said coin being configured for transporting heat away from the semiconductor die towards the heatsink; or the printed circuit board comprises a plurality of thermal vias extending in the printed circuit board and arranged in between the heatsink and the semiconductor die, wherein the die pad is connected to the central pad using a plurality of said conductive structures, said plurality of conductive structures forming a fence arranged around a perimeter of the semiconductor die, and wherein the central pad is configured as a ground pad.

2. The electronic package according to claim 1, wherein the heatsink is connected to the second surface of the printed circuit board using thermal paste.

3. The electronic package according to claim 1, wherein the heatsink comprises a heatsink base and a plurality of fins extending from the heatsink base.

4. The electronic package according to claim 1, wherein the electronic package comprises one or more surface mount devices mounted to the first surface of the printed circuit board, said one or more surface mount devices, together with the one or more metal traces or parts thereof, forming one or more passive circuits, and wherein at least one passive circuit among the one or more passive circuits is connected to a respective package terminal using a conductive structure.

5. The electronic package according to claim 1, wherein the package terminals comprise a plurality of balls for forming a ball grid array on the second side of the body of solidified molding compound.

6. The electronic package according to claim 1, wherein the electronic package comprises a Doherty amplifier of which a main amplifier and/or a peak amplifier are integrated on the semiconductor die, and wherein the main amplifier and the peak amplifier each comprise a respective RF power FET.

7. The electronic package according to claim 6, further comprising a plurality of said semiconductor dies, wherein the main amplifier and the peak amplifier are arranged on different semiconductor dies among said plurality of semiconductor dies.

8. The electronic package according to claim 6, wherein the Doherty amplifier comprises a Doherty combiner that is formed using a parasitic output capacitance of the main amplifier and the peak amplifier and a metal trace or bondwire connecting outputs of the main amplifier and the peak amplifier.

9. The electronic package according to claim 6, further comprising a further semiconductor die comprising a driver for the Doherty amplifier.

10. The electronic package according to claim 1, wherein the power FET is a gallium nitride based FET.

11. The electronic package according to claim 1, wherein the power FET is a silicon based laterally diffused metaloxide-semiconductor (LDMOS) transistor.

12. The electronic package according to claim 1, wherein the conductive structure is a copper pillar.

13. The electronic package according to claim 1, wherein the conductive structure is an embedded bondwire.

14. An electronic device, comprising:

a printed circuit board comprising a plurality of pads; and the electronic package according to claim 1 of which the package terminals are each connected to a pad among the plurality of pads.

15. An electronic package, comprising:

a printed circuit board having a first surface and a second surface opposing the first surface, said printed circuit board comprising a plurality of metal traces arranged on the first surface, the plurality of metal traces comprising a die pad;

a semiconductor die comprising electronic circuitry integrated thereon, said semiconductor die being mounted on the die pad and having a plurality of terminals for inputting and outputting electrical signals, wherein each terminal is electrically connected to a metal trace among the plurality of metal traces, wherein the semiconductor die comprises a first surface and a second surface opposing the first surface, wherein the semiconductor die is mounted with its first surface to the first surface of the printed circuit board, wherein the terminals of the semiconductor die are formed on the second surface of the semiconductor die, and wherein at least one terminal of the semiconductor die is electrically coupled to a respective metal trace using one or more bondwires, the semiconductor die comprising a conductive substrate or a substrate that is provided with vias for connecting ground of the electronic circuitry to the die pad;

a body of a solidified molding compound covering the first surface of the printed circuit board and encapsulating the semiconductor die at a first side of the body, said body having a second side opposite to the first side; and a plurality of package terminals arranged on the second side of the body of solidified molding compound, wherein each package terminal is electrically connected using a conductive structure that extends through the body of solidified molding compound, to a respective metal trace among the plurality of metal traces, wherein the plurality of package terminals comprises a central pad and remaining package terminals, wherein the remaining package terminals are arranged in a perimeter region of the second side of the body of solidified molding compound spaced apart from the central pad, wherein the die pad has a shape that is larger than a footprint of the semiconductor die, wherein the electronic package further comprises a heatsink that is fixedly connected to the second surface of the printed circuit board, wherein the die pad is connected to the central pad using a plurality of said conductive structures, said plurality of conductive structures forming a fence arranged around a perimeter of the semiconductor die, and wherein the central pad is configured as a ground pad.

16. The electronic package according to claim 15, wherein the conductive structure is a copper pillar.

17. The electronic package according to claim 15, wherein the conductive structure is an embedded bondwire.

* * * * *